(12) United States Patent
Sakane et al.

(10) Patent No.: US 10,374,358 B2
(45) Date of Patent: Aug. 6, 2019

(54) FEEDER-COVER STRUCTURE AND SEMICONDUCTOR PRODUCTION APPARATUS

(71) Applicant: Tokyo Electron Limited, Tokyo (JP)

(72) Inventors: Ryota Sakane, Miyagi (JP); Dai Kitagawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 77 days.

(21) Appl. No.: 14/597,312

(22) Filed: Jan. 15, 2015

(65) Prior Publication Data

US 2015/0214653 A1 Jul. 30, 2015

(30) Foreign Application Priority Data

Jan. 29, 2014 (JP) .................. 2014-014607

(51) Int. Cl.
| | | |
|---|---|---|
| *H01J 37/32* | (2006.01) | |
| *H01R 13/53* | (2006.01) | |
| *H01R 13/631* | (2006.01) | |
| *C23C 16/458* | (2006.01) | |
| *C23C 16/509* | (2006.01) | |
| *H01R 103/00* | (2006.01) | |

(52) U.S. Cl.
CPC ....... *H01R 13/631* (2013.01); *C23C 16/4586* (2013.01); *C23C 16/5096* (2013.01); *H01J 37/32577* (2013.01); *H01R 13/53* (2013.01); *C23C 16/509* (2013.01); *H01R 2103/00* (2013.01)

(58) Field of Classification Search
CPC ............... H01L 21/3065; H01L 21/302; C23C 16/4586; C23C 16/5096; C23C 16/509; H01J 37/32577; H01R 13/53; H01R 13/631; H01R 2103/00; H02G 15/20; H05K 7/202; H05K 7/20145; H05K 2203/086; H05K 2203/1178
USPC ....... 439/195, 485; 219/444.1, 468.1, 465.1; 392/46; 361/234, 128
See application file for complete search history.

(56) References Cited

U.S. PATENT DOCUMENTS

| | | | | |
|---|---|---|---|---|
| 5,625,526 | A * | 4/1997 | Watanabe | ............... G03F 7/707 361/234 |
| 6,840,799 | B2 * | 1/2005 | Yoshikawa | ........ H01R 13/6271 136/251 |
| 2008/0076279 | A1 * | 3/2008 | Wu | ........................ H01R 31/06 439/131 |
| 2009/0178764 | A1 * | 7/2009 | Kanno | .............. H01L 21/67103 156/345.52 |
| 2011/0122913 | A1 * | 5/2011 | Scharer | ................ G01N 25/486 374/29 |

(Continued)

FOREIGN PATENT DOCUMENTS

| | | |
|---|---|---|
| JP | 2008-047657 | 2/2008 |
| JP | 2011-222931 | 11/2011 |
| JP | 2013-143512 | 7/2013 |

*Primary Examiner* — Ibrahime A Abraham
*Assistant Examiner* — Chris Q Liu
(74) *Attorney, Agent, or Firm* — IPUSA, PLLC (57) ABSTRACT

A feeder-cover structure includes a power feeder including a socket and a plug fitted together, a cover structure that covers and seals the power feeder, and a supply mechanism that supplies dry air or an inert gas into the cover structure. A gap is formed between the power feeder and the cover structure such that the dry air or the inert gas is supplied through the gap into the cover structure.

9 Claims, 6 Drawing Sheets

(56) References Cited

U.S. PATENT DOCUMENTS

| | | | | |
|---|---|---|---|---|
| 2012/0018411 A1* | 1/2012 | Ricci | ............ | H01L 21/67103 219/121.58 |
| 2012/0138573 A1* | 6/2012 | Zwicky | ............ | H02B 13/005 218/68 |
| 2013/0267115 A1* | 10/2013 | Mark | ............ | H01R 13/005 439/485 |

* cited by examiner

FEEDER-COVER STRUCTURE AND SEMICONDUCTOR PRODUCTION APPARATUS

CROSS-REFERENCE TO RELATED APPLICATION

The present application is based upon and claims the benefit of priority of Japanese Patent Application No. 2014-014607, filed on Jan. 29, 2014, the entire contents of which are incorporated herein by reference.

BACKGROUND OF THE INVENTION

1. Field of the Invention

An aspect of this disclosure relates to a feeder-cover structure and a semiconductor production apparatus.

2. Description of the Related Art

In a semiconductor production apparatus that performs fine-processing on a semiconductor wafer (which is hereafter simply referred to as a "wafer") by, for example, etching, the etching rate is controlled by controlling the temperature of an electrostatic chuck (ESC) on which the wafer is placed. A proposed electrostatic chuck includes an embedded heater for directly heating the electrostatic chuck, and is thereby configured to improve the responsiveness of temperature control.

In a proposed configuration, for example, an electrostatic chuck is divided into multiple zones and heaters are embedded in the respective zones to perform temperature control of the zones independently. An alternating-current power supply is connected to the heaters to supply an electric current to each of the heaters. Power feeders are provided between the heaters embedded in the electrostatic chuck and heater filters, to supply the electric current from the alternating-current power supply to the heaters. Each power feeder includes a plug on the side of the heater filter and a socket on the side of the electrostatic chuck. When the plug is inserted into the socket, the power feeder can supply an electric current to the heater.

However, when the plug on the side of the heater filter is misaligned with the socket on the side of the electrostatic chuck, the plug may be bent and deformed before being inserted into the socket and it may become difficult to insert the plug into the socket. When the plug is greatly deformed, the tip of the plug may be tilted with respect to the socket and it may become difficult to insert the plug into the socket.

By the way, ambient air tends to enter from the outside into a lower space in a semiconductor production apparatus. When moisture enters the inside of a power feeder located in a lower side of the semiconductor production apparatus, the power feeder may burn out due to condensation. Therefore, it is important to take measures to prevent condensation around the power feeder. As an example of a condensation prevention measure, the lower space of the semiconductor production apparatus may be sealed and filled with dry air. When this measure is not sufficient, dry air may be introduced directly into the power feeder to prevent condensation.

However, when multiple power feeders are provided to independently control the temperatures of multiple zones of an electrostatic chuck, it is necessary to provide a mechanism to introduce dry air for each of the power feeders. This in turn increases the number of components of a semiconductor production apparatus and complicates the process of assembling the semiconductor processing apparatus.

SUMMARY OF THE INVENTION

In an aspect of this disclosure, there is provided a feeder-cover structure that includes a power feeder including a socket and a plug fitted together, a cover structure that covers and seals the power feeder, and a supply mechanism that supplies dry air or an inert gas into the cover structure. A gap is formed between the power feeder and the cover structure such that the dry air or the inert gas is supplied through the gap into the cover structure.

DESCRIPTION OF THE PREFERRED EMBODIMENTS

Embodiments of the present invention are described below with reference to the accompanying drawings. Throughout the specification and the drawings, the same reference numbers are assigned to substantially the same components, and repeated descriptions of those components are omitted.

<Overall Configuration of Semiconductor Production Apparatus>

Figure 1:
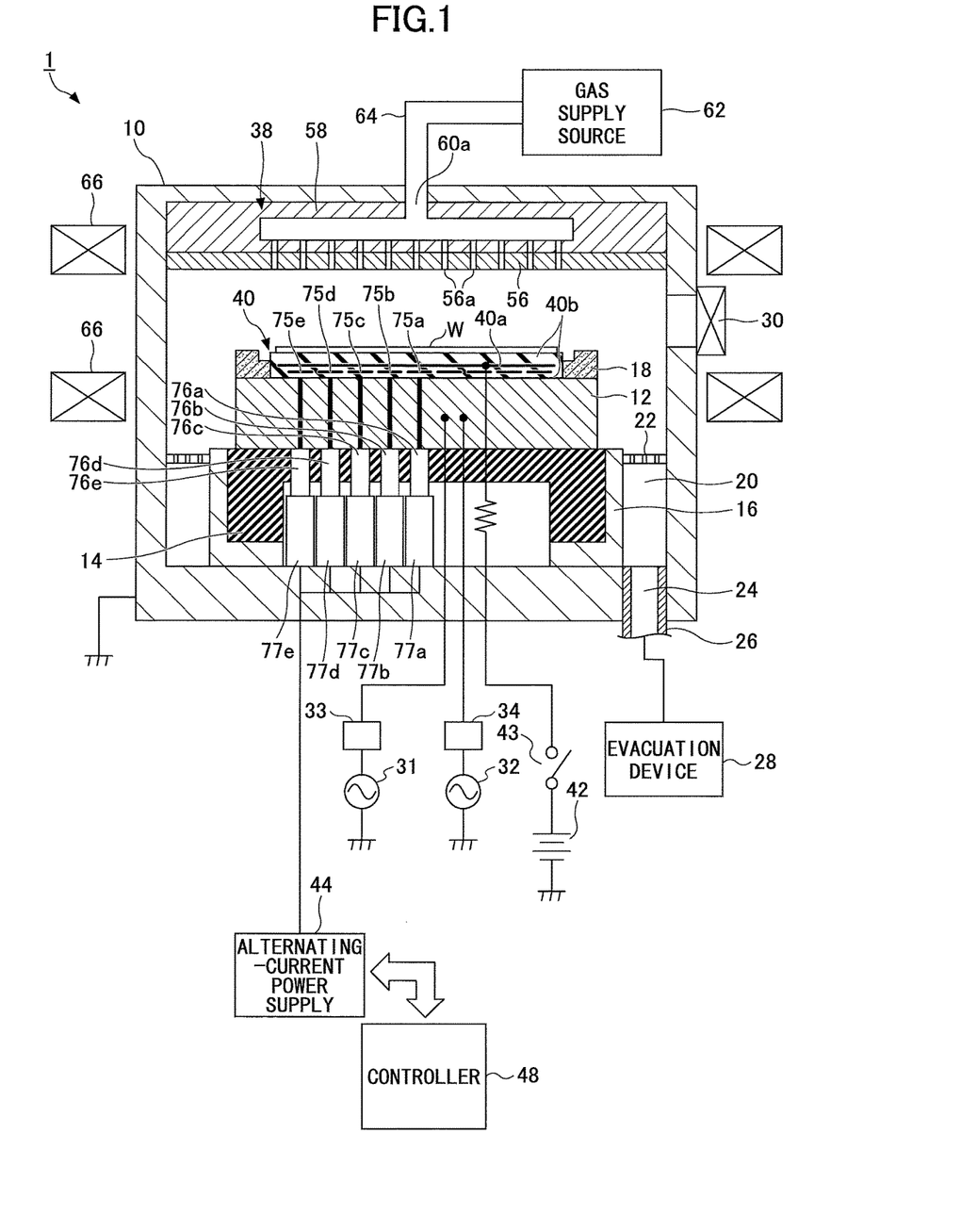
FIG. 1 is a drawing illustrating an exemplary configuration of a semiconductor production apparatus.

First, an overall configuration of a semiconductor production apparatus 1 according to an embodiment is described with reference to FIG. 1. FIG. 1 is a drawing illustrating an exemplary configuration of the semiconductor production apparatus 1. In the present embodiment, a capacitively-coupled plasma etching apparatus is used as an example of the semiconductor production apparatus 1. The semiconductor production apparatus 1 includes a cylindrical vacuum chamber (process chamber) 10 comprised of aluminum whose surface is alumite-treated (or anodized). The chamber 10 is grounded.

A mount table is provided in the chamber 10. The mount table 12 is comprised of, for example, aluminum (Al), titanium (Ti), or silicon carbide (SiC), and is supported via a holding part 14 having insulating properties by a support 16 that extends vertically upward from the bottom of the chamber 10.

An evacuation channel 20 is formed between an inner wall of the chamber 10 and the support 16. A circular baffle board 22 is placed in the evacuation channel 20. An evacuation pipe 26 forming an evacuation port 24 is provided at the bottom of the evacuation channel 20, and the evacuation pipe 26 is connected to an evacuation device 28. The evacuation device 28 is implemented by a vacuum pump such as a turbo molecular pump or a dry pump and reduces the pressure of a process space in the chamber 10 to a predetermined vacuum pressure. A gate valve 30 is attached to a side wall of the chamber 10. The gate valve 30 opens and closes a port for carrying a wafer W into and out of the chamber 10.

A first high-frequency power supply 31 for exciting plasma is connected via a matching box 33 to the mount table 12. Also, a second high-frequency power supply 32 for attracting ions to the wafer W is connected via a matching box 34 to the mount table 12. The first high-frequency power supply 31 applies, to the mount table 12, high-frequency power with a frequency of, for example, 60 MHz, which is suitable to generate plasma in the chamber 10. The second high-frequency power supply 32 applies, to the mount table 12, high-frequency power with a relatively-lower frequency of, for example, 0.8 MHz, which is suitable to attract ions in the plasma to the wafer W on the mount table 12. Thus, the mount table 12 functions as a table on which the wafer W is placed as well as a lower electrode.

An electrostatic chuck 40 for holding the wafer W with electrostatic attraction is provided on an upper surface of the mount table 12. The electrostatic chuck 40 includes an electrode 40a made of a conductive film and a pair of insulating layers 40b (or insulating sheets) sandwiching the electrode 40a. A direct voltage source 42 is connected via a switch 43 to the electrode 40a. When a voltage from the direct voltage source 42 is applied, the electrostatic chuck 40 attracts and holds the wafer W with a Coulomb force. A focus ring 18 comprised of, for example, silicon or quartz is provided around the electrostatic chuck 40 to improve the in-plane uniformity of etching.

A shower head 38 is provided on the ceiling of the chamber 10. The shower head 38 functions as an upper electrode that is at a ground potential. With this configuration, the high-frequency power from the first high-frequency power source 31 is applied to a "capacitor" formed between the mount table 12 and the shower head 38.

The shower head 38 at the ceiling of the chamber 10 includes an electrode plate 56 having multiple gas holes 56a, and an electrode support 58 that detachably supports the electrode plate 56. A gas supply source 62 supplies a gas via a gas supply pipe 64 and a gas inlet 60a into the shower head 38. The gas is introduced via the gas holes 56a into the chamber 10. Ring-shaped or concentric magnets 66 are disposed around the chamber 10 to control plasma generated in a plasma generation space between the upper electrode and the lower electrode with a magnetic force.

The electrostatic chuck 40 is divided into multiple zones, and heaters 75a, 75b, 75c, 75d, and 75e (which may be collectively referred to as "heaters 75") are embedded in the corresponding zones of the electrostatic chuck 40. Instead of being embedded in the electrostatic chuck 40, the heaters 75 may be attached to the back surface of the electrostatic chuck 40.

The heaters 75a, 75b, 75c, 75d, and 75e are connected, respectively, to feeder-cover structures 76a, 76b, 76c, 76d, and 76e (which may be collectively referred to as "feeder-cover structures 76"). The feeder-cover structures 76a, 76b, 76c, 76d, and 76e are disposed, respectively, between the heaters 75a, 75b, 75c, 75d, and 75e and heater filters 77a, 77b, 77c, 77d, and 77e (which may be collectively referred to as "heater filters 77").

As described later, each feeder-cover structure 76 includes a power feeder and a cover structure, and also includes a mechanism for preventing misalignment of the power feeder and condensation. Each heater filter 77 is implemented by, for example, a coil, and removes the high-frequency power applied by the first high-frequency power source 31 and the second high-frequency power source 32 to protect an alternating-current power supply 44.

In the example of FIG. 1, the feeder-cover structures 76 and the heater filters 77 are arranged in parallel. However, the feeder-cover structures 76 and the heater filters 77 may be disposed in any position as long as they can be connected to the corresponding heaters 75. With the above configuration, the heaters 75 are connected via the feeder-cover structures 76 and the heater filters 77 to the alternating-current power source 44, and an electric current is supplied from the alternating-current power source 44 to the heaters 75.

The temperatures of the zones of the electrostatic chuck 40 are independently controlled by cooling the zones with a chiller unit (not shown) and heating the zones with the heaters 75 to adjust the temperature of the wafer W to a desired value. This temperature control is performed based on a command (instruction or signal) from a controller 48. The controller 48 includes a central processing unit (CPU), a read-only memory (ROM), and a random access memory (RAM), and controls processes such as an etching process and a temperature control process according to procedures defined in recipes stored in, for example, the RAM.

The number of the heaters 75 or the number of zones of the electrostatic chuck 40 may be any value greater than or equal to one. The same number of the feeder-cover structures 76 and the heater filters 77 as the number of the heaters 75 are necessary.

When performing a process such as etching with the semiconductor production apparatus 1 configured as described above, the wafer W held on a conveying arm (not shown) is carried via the opened gate valve 30 into the chamber 10. The wafer W is held above the electrostatic chuck 40 by pusher pins (not shown) and is placed on the electrostatic chuck 40 by lowering the pusher pins. After the wafer W is carried into the chamber 10, the gate valve 30 is closed. The pressure in the chamber 10 is reduced to a preset value by the evacuation device 28. A gas is introduced in the form of a shower via the shower head 38 into the chamber 10. High-frequency power with a predetermined power level is applied to the mount table 12. Also, a voltage is applied from the direct voltage source 42 to the electrode 40a of the electrostatic chuck 40 to electrostatically-attract the wafer W on the electrostatic chuck 40.

The introduced gas is ionized or disassociated by the high-frequency power to generate plasma, and a process such as etching is performed on the wafer W by the plasma.

After the plasma etching is completed, the wafer W is held on the conveying arm and carried out of the chamber 10. The above process is repeated to process multiple wafers W in succession. An exemplary overall configuration of the semiconductor production apparatus 1 of the present embodiment is described above.

<Feeder-Cover Structure>

Figure 2A:
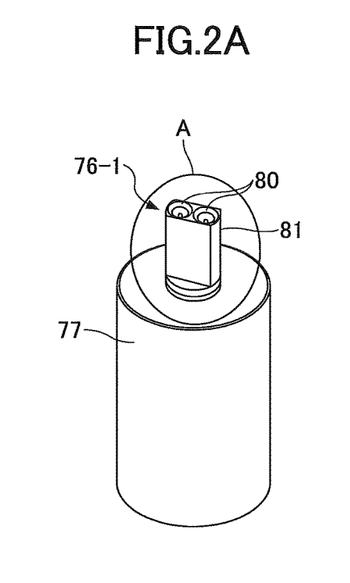
FIGS. 2A and 2B are drawings illustrating an exemplary configuration of a plug-side of a feeder-cover structure.
Figure 2B:
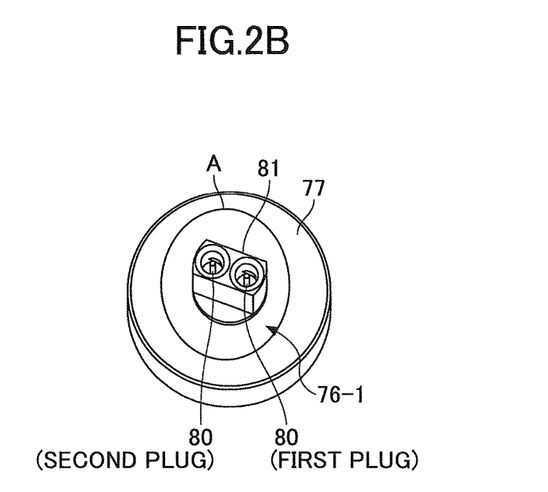
Figure 3A:
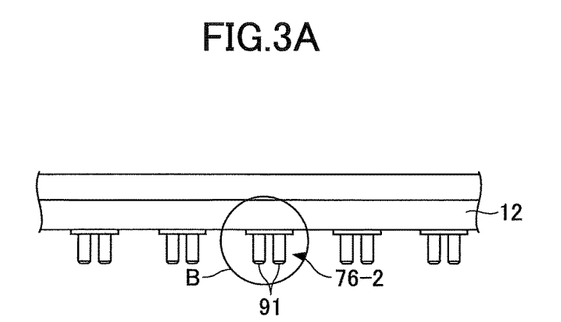
FIGS. 3A and 3B are drawings illustrating an exemplary configuration of a socket-side of a feeder-cover structure.
Figure 3B:
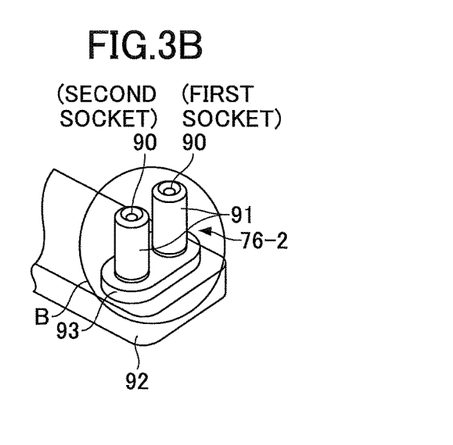
Figure 4:
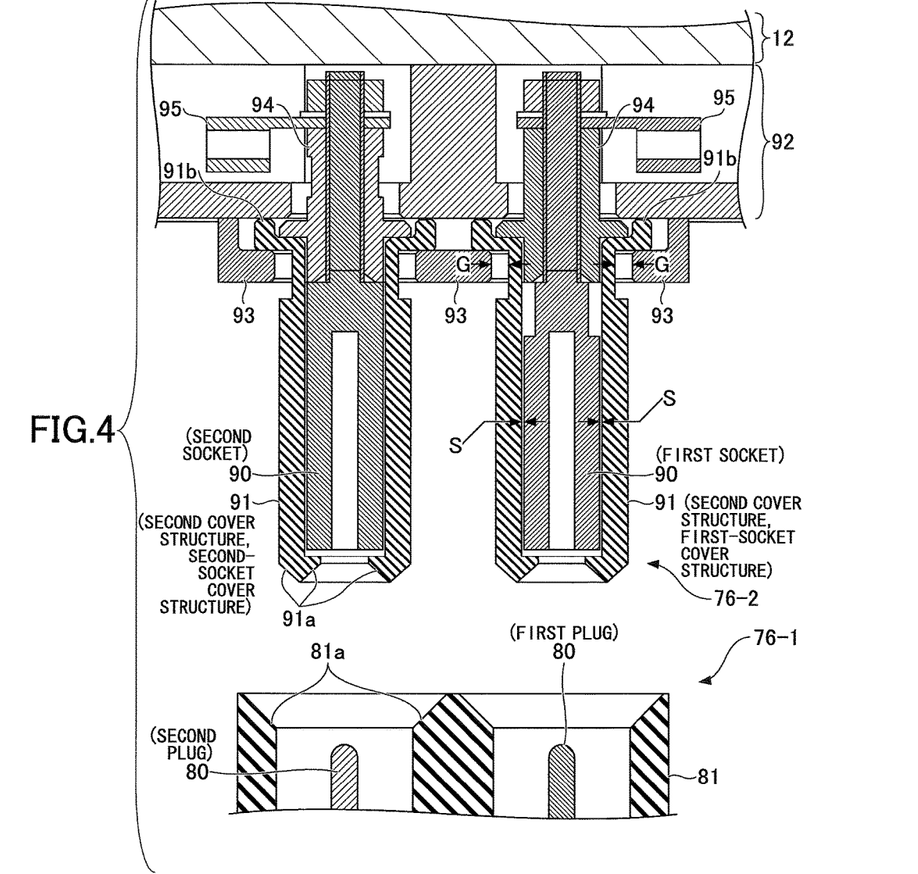
FIG. 4 is a cut-away side view of a feeder-cover structure.

Next, an exemplary configuration of the feeder-cover structure 76 according to the present embodiment is described with reference to FIGS. 2A through 4. FIGS. 2A and 2B are drawings illustrating an exemplary configuration of a plug side of the feeder-cover structure 76. FIGS. 3A and 3B are drawings illustrating an exemplary configuration of a socket side of the feeder-cover structure 76. FIG. 4 is a cut-away side view of the feeder-cover structure 76. The feeder-cover structures 76a, 76b, 76c, 76d, and 76e in FIG. 1 have the same configuration. Therefore, the description of the feeder-cover structure 76 below applies to all of the feeder-cover structures 76a, 76b, 76c, 76d, and 76e.

FIG. 2A is a perspective view of a feeder-cover structure 76-1 (plug side) of the feeder-cover structure 76 facing (or located closer to) the heater filter 77, and FIG. 2B is an enlarged (top) view of an area A of the feeder-cover structure 76-1 in FIG. 2A. The feeder-cover structure 76-1 facing the heater filter 77 includes two plugs (first plug and second plug) 80 and a first resin cover (cover structure) 81. Two holes are formed in the first resin cover 81. Each plug 80 is disposed in the center of the corresponding hole of the first resin cover 81 such that a space is formed between the plug 80 and an inner side wall of the hole, and extends vertically from the heater filter 77. Thus, the two plugs 80 are covered and protected by the first resin cover 81. Sockets 90 described below are to be placed in spaces formed in the first resin cover 81. The first resin cover 81 is an example of a first cover structure for covering the plugs 80.

FIG. 3A is a drawing illustrating a feeder-cover structure 76-2 (socket side) of the feeder-cover structure 76 facing (or located closer to) the electrostatic chuck 40, and FIG. 3B is an enlarged (upside-down) view of an area B of the feeder-cover structure 76-2 in FIG. 3A. The feeder-cover structure 76-2 facing the electrostatic chuck 40 includes two sockets (first socket and second socket) 90 and second resin covers (first-socket cover structure and second-socket cover structure) 91 covering the sockets 90. Thus, the two sockets 90 are covered and protected by the second resin covers 91. In the descriptions below, the feeder-cover structure 76-1 facing the heater filter 77 and the feeder-cover structure 76-2 facing the electrostatic chuck 40 may be collectively referred to as the "feeder-cover structure 76". The second resin covers 91 are examples of second cover structures (first-socket cover structure and second-socket cover structure) for covering the sockets 90.

Figure 6A:
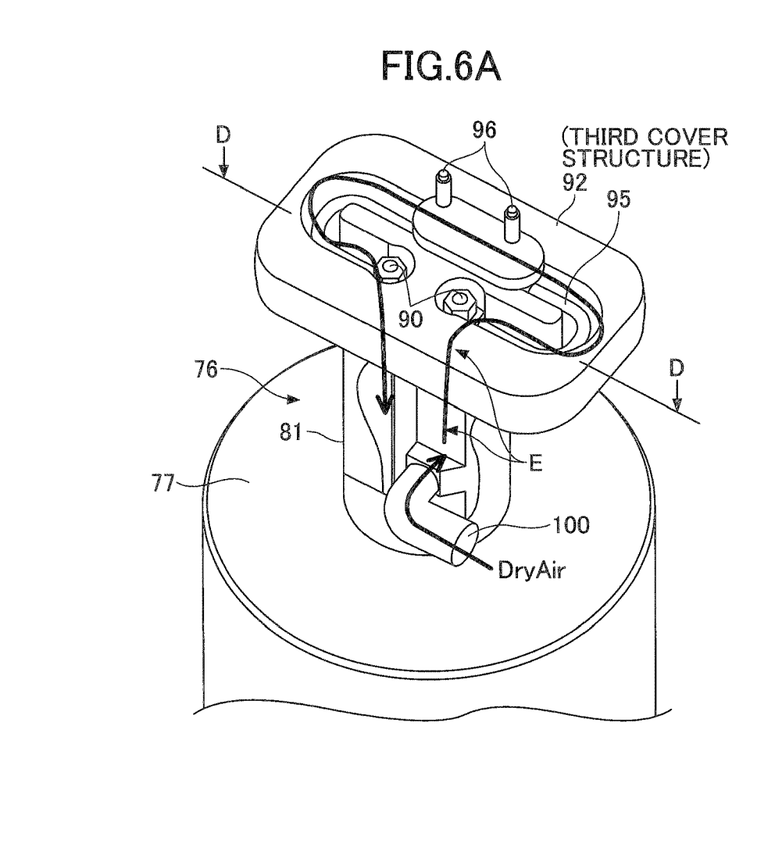
FIGS. 6A and 6B are drawings illustrating an exemplary dry-air supply mechanism.
Figure 6B:
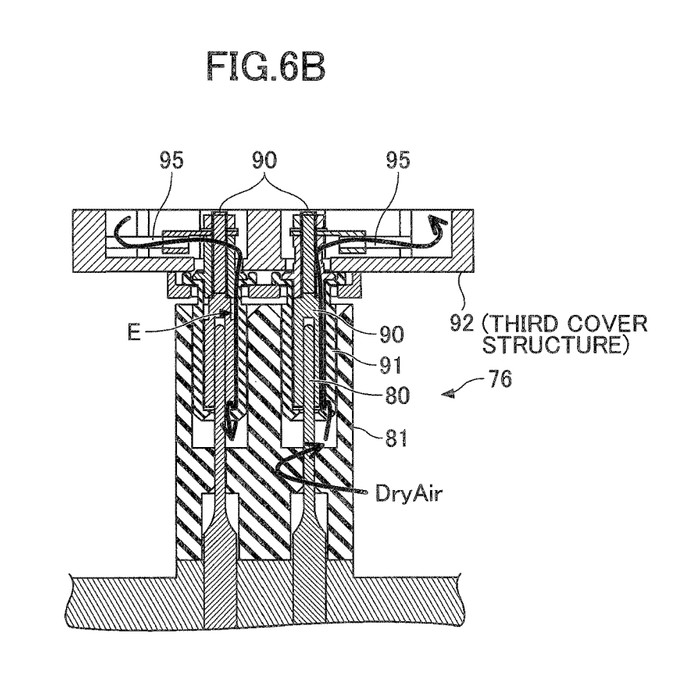

The plugs (first plug and second plug) 80 of the feeder-cover structure 76-1 in the lower part of FIG. 4 correspond to male terminals, and the sockets (first socket and second socket) 90 of the feeder-cover structure 76-2 in the upper part of FIG. 4 correspond to female terminals. The plugs 80 and the sockets 90 are fitted together by inserting the plugs 80 into the sockets 90, and thereby function as a power feeder for supplying an electric current. In the descriptions below, the plugs 80 and the sockets 90 fitted together may be referred to as a "power feeder" or "terminals". A state where the plugs 80 and the sockets 90 are fitted together is illustrated by FIG. 6B and is described later.

The plugs 80 and the sockets 90 are comprised of a metal. The first resin cover 81 and the second resin covers 91 are comprised of an insulating material. Preferably, the first resin cover 81 and the second resin covers 91 are comprised of a synthetic resin such as polyether ether ketone (PEEK) having a high mechanical strength and a low friction coefficient. Using a resin for the first resin cover 81 and the second resin covers 91 is to insulate and protect terminals composed of the plugs 80 and the sockets 90.

One or both of the first resin cover 81 and the second resin covers 91 may instead be comprised of a metal or ceramic. However, the material(s) of the first resin cover 81 and the second resin covers 91 needs to be selected taking into account insulation between plugs and between sockets, contact between the first resin cover 81 and the second resin covers 91 when they are fitted together, and contact between the covers 81 and 91 and the terminals. Taking into account these factors, both of the first resin cover 81 and the second resin covers 91 are preferably comprised of a resin.

The first resin cover 81 has tapered ends 81a that slope inward. Similarly, each of the second resin covers 91 has a tapered end 91a that slopes outward and inward. The tapered ends 81a and 91a guide the sockets 90 and the second resin covers 91 into the internal spaces of the first resin cover 81, and guide the plugs 80 into the sockets 90. This configuration makes it possible to smoothly insert the sockets 90 and the second resin covers 91 into the internal spaces of the first resin cover 81, and fit the plugs 80 and the sockets 90 together. The first resin cover 81 and/or the second resin covers 91 is an example of a cover structure for covering and sealing the power feeder.

The feeder-cover structure 76-2 facing the electrostatic chuck 40 has a floating structure. That is the sockets 90 and the second resin covers 91 are suspended and supported below the mount table 12 by a third resin cover 92 comprised of a resin. The second resin covers 91 are slidably supported by a fixing part 93. More specifically, a suspension part 91b protruding in a radial direction is formed at the upper end of each second resin cover 91, and the second resin cover 91 is suspended via the suspension part 91b by the fixing part 93. A ring-shaped gap G is formed between the second resin cover 91 and the fixing part 93. With this configuration, the second resin cover 91 can slide laterally up to a distance twice the gap G while holding the socket 90. The socket 90 protrudes from an upper opening of the second resin cover 91, passes through an annular part 94, and enters the inside of the third resin cover 92. The third resin cover 92 is supported directly or via the holding part 14 by the mount table 12.

Thus, the feeder-cover structure 76 of the present embodiment includes the first resin cover 81 and the second resin covers 91 that have the tapered ends 81a and 91a. With this configuration, when the plug 80 is inserted into the socket 90, the second resin cover 91 is guided by the tapered end 81a of the first resin cover 81, and the feeder-cover structure 76-2 facing the electrostatic chuck 40 slides accordingly. As a result, misalignment between the feeder-cover structure 76-1 facing the heater filter 77 and the feeder-cover structure 76-2 facing the electrostatic chuck 40 is automatically corrected.

According to the present embodiment, the feeder-cover structure 76-1 is configured such that the plugs 80 are covered by the first resin cover 81 having a thickness that enables the first resin cover 81 to function as a guide. Also according to the present embodiment, the feeder-cover structure 76-2 is configured such that the sockets 90 are covered by the second resin covers 91 having a thickness that enables the second resin covers 91 to function as guides. This configuration makes it possible to provide a guide function without using sockets having a special shape.

In the present embodiment, both of the end 81a of the first resin cover 81 and the end 91a of the second resin cover 91 are tapered. However, the present invention is not limited to this configuration. For example, at least one of the end 81a of the first resin cover 81 and the end 91a of the second resin cover 91 may be tapered. Here, it is necessary to increase the length of a tapered end as the maximum expected amount of misalignment between the plug 80 and the socket 90 becomes greater.

Figure 5:
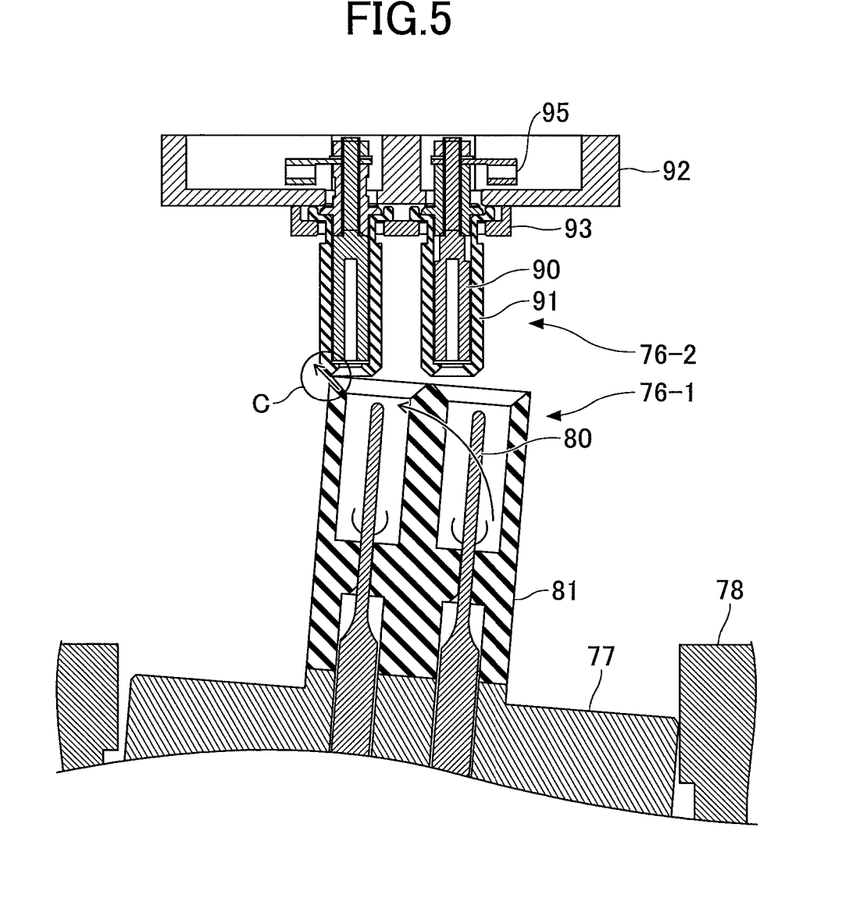
FIG. 5 is a cut-away side view of a feeder-cover structure.

When the heater filter 77 attached to a fixing part 78 is tilted as illustrated by FIG. 5, the sockets 90 and the plugs 80 are misaligned in horizontal and oblique directions. In this case, in area C in FIG. 5, the tilted heater filter 77 is guided by the tapered ends 81a and 91a of the first resin cover 81 and the second resin cover 91. As a result, the feeder-cover structure 76-1 facing the electrostatic chuck 40 slides accordingly, and the misalignment between the feeder-cover structure 76-1 and the feeder-cover structure 76-2 is automatically corrected.

After the misalignment is corrected, the plugs 80 facing the heater filter 77 are inserted into the sockets 90 facing the electrostatic chuck 40, and the plugs 80 and the sockets 90 are thereby electrically connected to each other. That is, the feeder-cover structure 76 is assembled.

As illustrated in FIG. 4, the terminals composed of the sockets 90 and the plugs 80 are connected to wires 95 in the third resin cover 92. The wires 95 implement power lines connected to the heater 75 in the electrostatic chuck 40. Thus, the sockets 90 and the plugs 80 are fitted together after they are aligned. This configuration makes it possible to electrically connect the heater 75 via the feeder-cover structure 76 to the alternating-current power supply 44 without damaging the terminals.

As described above, the feeder-cover structure 76 includes the feeder-cover structure 76-2 that has a slidable floating structure and has a guide function. This configuration makes it possible to automatically correct misalignment between the plugs 80 and the sockets 90. That is, with the above configuration, the plugs 80 and the sockets 90 can be self-aligned with each other.

<Mechanism for Preventing Condensation>

A dry-air supply mechanism provided in the feeder-cover structure 76 to prevent condensation is described below with reference to FIGS. 6A and 6B. FIGS. 6A and 6B are drawings illustrating an exemplary dry-air supply mechanism. FIG. 6A is a perspective view of the feeder-cover structure 76 disposed between the heater filter 77 and the third resin cover (third cover structure) 92 provided on the lower surface of the mount table 12 (see FIG. 1). FIG. 6B is a cross-sectional view of the third resin cover (third cover structure) 92 and the feeder-cover structure 76 taken along line D-D in FIG. 6A.

As described above, in the feeder-cover structure 76 of the present embodiment, the first resin cover 81 covers the second resin covers 91 including the sockets 90. In other words, the first resin cover 81 functions as a cover of the entire feeder-cover structure 76 and protects the terminals. Gaps between the first resin cover 81 and the second resin covers 91 are minimized to sufficiently seal the feeder-cover structure 76. This is described in more detail below.

As described above, the feeder-cover structure 76 is configured such that the plugs 80 and the sockets 90 are self-aligned with each other. This self-alignment function makes it unnecessary to increase the diameter of the holes of the sockets 90 more than necessary taking into account the misalignment between the plugs 80 and the sockets 90. Thus, the configuration of the present embodiment makes it possible to minimize the gaps between the first resin cover 81 and the second resin covers 91. This in turn makes it difficult for dry air to flow between the first resin cover 81 and the second resin covers 91, and makes it possible to seal the feeder-cover structure 76 in a simple manner without using a sealing part such as an O-ring. Accordingly, the feeder-cover structure 76 of the present embodiment can be produced using a small number of components having relatively simple shapes at relatively low costs.

In FIG. 6A, a part of the feeder-cover structure 76 is exposed to make the dry-air supply mechanism visible. The dry-air supply mechanism supplies dry air and forms a circulation path E of dry air.

Dry air circulates along the circulation path E in the feeder-cover structure 76 and the third resin cover 92. The feeder-cover structure 76 is sealed by the first resin cover 81 and the second resin covers 91. The upper surface of the third resin cover 92 is in close contact with the lower surface of the mount table 12 or with the holding part 14.

As illustrated in FIG. 4, a gap S is formed between the socket 90 and the second resin cover 91. With the gap S between the socket 90 and the second resin cover 91, the circulation path E can be formed around the terminal of the feeder-cover structure 76. Condensation on the terminal can be prevented by circulating dry air along the circulation path E. The gap S is preferably set at a minimum width that is necessary to allow dry air to circulate to prevent condensation.

Thus, the feeder-cover structure 76 includes the circulation path E for circulating dry air around the terminal to prevent condensation. Therefore, it is not necessary to completely seal the feeder-cover structure 76, and a simple sealing mechanism using cover structures as described above is sufficient for the feeder-cover structure 76.

The feeder-cover structure 76 includes a gas pipe 100 for introducing dry air. In the present embodiment, the gas pipe 100 is provided on the first resin cover 81 facing the heater filter 77. However, the gas pipe 100 may instead be provided on the third resin cover 92 facing the electrostatic chuck 40. Because the feeder-cover structure 76 is sealed, one inlet is sufficient to introduce dry air.

Dry air is an example of a gas for preventing condensation. Any type of gas that can prevent condensation may be supplied into the circulation path E. Examples of other types of gas include inert gases such as nitrogen ($N_2$).

The internal space of the gas pipe 100 communicates with the gap S between the socket 90 and the second resin cover 91. As described above, the gap between the first resin cover 81 and the second resin cover 91 is minimized to prevent or minimize leakage of dry air through the gap. This configuration enables dry air supplied from a dry air source (not shown) and introduced via the gas pipe 100 into the feeder-cover structure 76 to circulate along the circulation path E. That is, the feeder-cover structure 76 is configured such that the dry air flows through the gas pipe 100, the gap S between a first set of the socket 90 and the second resin cover 91, the internal space of the third resin cover 92, and the gap S between a second set of the socket 90 and the second resin cover 91 in this order. This configuration makes it possible to prevent condensation on and around the terminals.

Upper ends of the terminals composed of the sockets 90 and the plugs 80 (or the upper ends of the sockets 90) are connected to the wires 95 in the third resin cover 92. The wires 95 are connected to connection terminals 96, and the connection terminals 96 are connected to the heater 75 in the electrostatic chuck 40. Thus, the wires 95 implement power lines connected to the heater 75 in the electrostatic chuck 40.

Exemplary configurations of the dry-air supply mechanism and the circulation path E of dry air according to the present embodiment are described above.

<Process of Inserting Plugs into Sockets>

Figure 7:
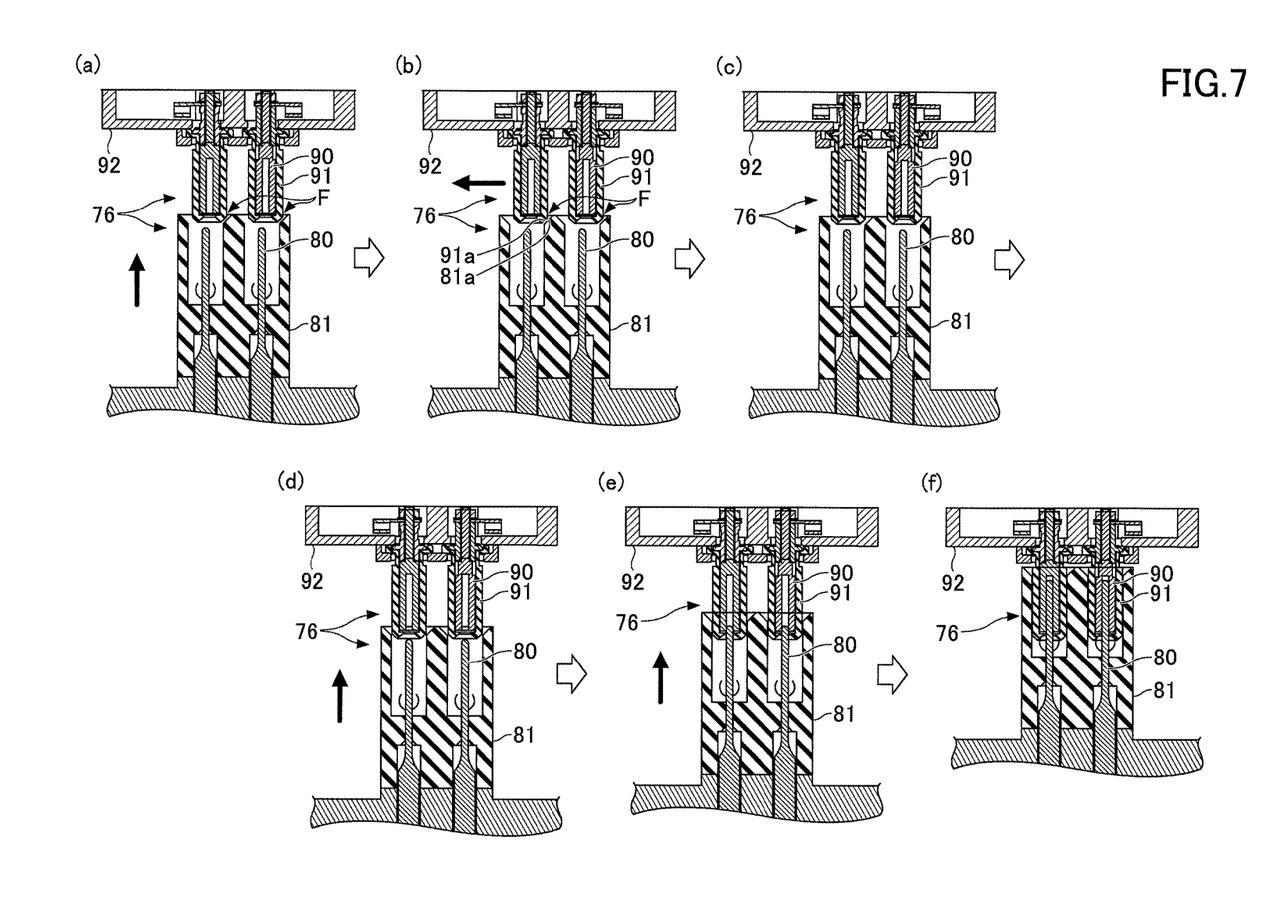
FIG. 7 is a drawing illustrating an exemplary process of inserting plugs into sockets.

An exemplary process of inserting the plugs 80 into the sockets 90 is described below with reference to FIG. 7. FIG. 7 is a drawing illustrating an exemplary process of inserting the plugs 80 into the sockets 90. The plugs 80 are inserted into the sockets 90 when, for example, assembling or maintaining the semiconductor production apparatus 1.

As illustrated by FIG. 7 (*a*), the plugs 80 and the first resin cover 81 facing the heater filter 77 are moved upward to a position close to the sockets 90 and the second resin covers 91 facing the electrostatic chuck 40. In the example of FIG. 7 (*a*), the plugs 80 and the sockets 90 are misaligned, and the lower right tapered surface of the end 91*a* of each of the second resin covers 91 is in contact with the upper right tapered surface of the corresponding end 81*a* of the first resin cover 81 as indicated by "F".

The end 91a of the second resin cover 91 is guided by the end 81a of the first resin cover 81. Accordingly, as illustrated by FIG. 7 (b), the feeder-cover structure 76-2 facing the electrostatic chuck 40 slides to the left in FIG. 7 (b). As a result, as illustrated by FIG. 7 (c), the misalignment between the plugs 80 and the sockets 90 is automatically corrected, and the plugs 80 are positioned directly below the sockets 90.

Next, the feeder-cover structure 76-1 facing the heater filter 77 is moved upward as illustrated by FIG. 7 (d), and is further moved upward as illustrated by FIG. 7 (e) to insert the plugs 80 into the holes of the sockets 90. Then, as illustrated by FIG. 7 (f), the plugs 80 are completely inserted into the sockets 90. As a result, the terminals composed of the plugs 80 and the sockets 90 are sealed and protected by the first resin cover 81. Also, the circulation path E for supplying dry air around the terminals is formed by the gaps S between the sockets 90 and the second resin covers 91.

In the example of FIG. 7, the feeder-cover structure 76-1 facing the heater filter 77 is moved toward the feeder-cover structure 76-2 facing the electrostatic chuck 40. Alternatively, the feeder-cover structure 76-2 facing the electrostatic chuck 40 (or the mount table 12) may be moved downward to move the sockets 90 and the second resin covers 91 toward the plugs 80 and the first resin cover 81.

An exemplary process of inserting the plugs 80 into the sockets 90 is described above. According to the present embodiment, the first resin cover 81 and the second resin covers 91 provide a guide function, and the feeder-cover structure 76-2 has a floating structure that provides a sliding function. This configuration makes it possible to automatically align the plugs 80 and the sockets 90 with each other, and thereby makes it possible to improve working efficiency.

Also, the present embodiment makes it possible to seal the feeder-cover structure 76 in a simple manner using the first and second resin covers 81 and 91, and to form a circulation path for circulating dry air around the terminals. Thus, the present embodiment makes it possible to prevent condensation on and around the terminals.

A feeder-cover structure and a semiconductor production apparatus according to embodiments of the present invention are described above. However, the present invention is not limited to the specifically disclosed embodiments, and variations and modifications may be made without departing from the scope of the present invention. Also, the embodiments and their variations may be combined in any appropriate manner.

For example, the feeder-cover structure of the above embodiment may be applied not only to a capacitively-coupled plasma (CCP) apparatus but also to other types of semiconductor production apparatuses. Examples of other types of semiconductor production apparatuses may include an inductively-coupled plasma (ICP) apparatus, a chemical vapor deposition (CVD) apparatus using a radial line slot antenna, a helicon wave plasma (HWP) apparatus, and an electron cyclotron resonance (ECR) plasma apparatus.

The present invention may be applied not only to a semiconductor production apparatus for processing a wafer, but also to a semiconductor production apparatus for processing a large-size substrate for a flat panel display, an EL element, or a substrate for a solar battery.

An aspect of this disclosure provides a feeder-cover structure and a semiconductor production apparatus that can prevent condensation on a power feeder.

What is claimed is:

1. A feeder-cover structure, comprising:
a power feeder including a socket and a plug that are fitted together and electrically connected to each other;
a cover structure that covers and seals the power feeder; and
a supply mechanism that supplies one of dry air and an inert gas into the cover structure, wherein
the cover structure includes a first cover structure for covering the plug and a second cover structure for covering the socket, the first cover structure also housing the second cover structure;
a gap is formed between the socket and the second cover structure to surround an entire circumference of the socket, the gap forming a part of a flow path and allowing the one of the dry air and the inert gas to flow around the entire circumference of the socket;
the supply mechanism communicates with the gap between the socket and the second cover structure;
the socket is attached to an electrostatic chuck, and the plug is attached to a heater filter; and
the socket and the second cover structure are supported such that the socket and the second cover structure are slidable relative to the electrostatic chuck in a direction that is orthogonal to a direction in which the plug is inserted into the socket.

2. The feeder-cover structure as claimed in claim 1, wherein an end of at least one of the first cover structure and the second cover structure is tapered.

3. The feeder-cover structure as claimed in claim 2, wherein
the tapered end of the at least one of the first cover structure and the second cover structure is configured to guide the second cover structure relative to the first cover structure and thereby cause the socket to slide relative to the electrostatic chuck to correct misalignment between the socket and the plug.

4. The feeder-cover structure as claimed in claim 1, wherein at least one of the first cover structure and the second cover structure comprises an insulating material.

5. The feeder-cover structure as claimed in claim 1, wherein the first cover structure and the second cover structure comprise a resin material.

6. A semiconductor production apparatus, comprising:
a mount table;
an electrostatic chuck disposed on the mount table;
a heater provided in the electrostatic chuck;
a feeder-cover structure; and
a power source that supplies an electric current to the heater, wherein
the feeder-cover structure includes
a power feeder that connects the power source to the electrostatic chuck and includes a socket and a plug that are fitted together and electrically connected to each other,
a cover structure that covers and seals the power feeder, and
a supply mechanism that supplies one of dry air and an inert gas into the cover structure;
the cover structure includes a first cover structure for covering the plug and a second cover structure for covering the socket, the first cover structure also housing the second cover structure;
a gap is formed between the socket and the second cover structure to surround an entire circumference of the socket, the gap forming a part of a flow path and allowing the one of the dry air and the inert gas to flow around the entire circumference of the socket;
the supply mechanism communicates with the gap between the socket and the second cover structure;
the socket is attached to the electrostatic chuck, and the plug is attached to a heater filter; and
the socket and the second cover structure are supported such that the socket and the second cover structure are slidable relative to the electrostatic chuck in a direction that is orthogonal to a direction in which the plug is inserted into the socket.

7. A feeder-cover structure, comprising:

a first power feeder including a first socket and a first plug fitted together;

a second power feeder including a second socket and a second plug fitted together;

a first cover structure for covering the first plug and the second plug;

a first-socket cover structure for covering the first socket;

a second-socket cover structure for covering the second socket, the first-socket cover structure being separate from the second-socket cover structure;

a third cover structure that connects an upper end of the first-socket cover structure to an upper end of the second-socket cover structure; and a supply mechanism that supplies one of dry air and an inert gas, wherein the first cover structure is configured to also cover the first-socket cover structure and the second-socket cover structure;

a first gap is formed between the first socket and the first-socket cover structure to surround an entire circumference of the first socket, the first gap allowing the one of the dry air and the inert gas to flow around the entire circumference of the first socket;

a second gap is formed between the second socket and the second-socket cover structure to surround an entire circumference of the second socket, the second gap allowing the one of the dry air and the inert gas to flow around the entire circumference of the second socket;

a path connecting the first gap and the second gap is formed by the third cover structure;

the feeder-cover structure is configured such that the one of the dry air and the inert gas supplied from the supply mechanism flows through the first gap into the path connecting the first gap and the second gap, flows through the path into the second gap, and then flows through the second gap;

the first socket and the second socket are attached to an electrostatic chuck; and the first socket, the second socket, the first-socket cover structure, and the second-socket cover structure are supported so as to be slidable relative to the electrostatic chuck in a direction that is orthogonal to a direction in which the first plug and the second plug are inserted into the first socket and the second socket.

8. The feeder-cover structure as claimed in claim 7, wherein the third cover structure supports the upper end of the first-socket cover structure and the upper end of the second-socket cover structure.

9. The feeder-cover structure as claimed in claim 7, wherein the first cover structure includes holes in which the first-socket cover structure and the second-socket cover structure are placed; and the supply mechanism is configured to supply the one of the dry air and the inert gas into one of the holes of the first cover structure in which the first-socket cover structure is placed.

\* \* \* \* \*